(12) United States Patent
Jung et al.

(10) Patent No.: US 12,367,927 B2
(45) Date of Patent: Jul. 22, 2025

(54) PSEUDO-DIFFERENTIAL DE-GLITCH SENSE AMPLIFIER

(71) Applicant: QUALCOMM Incorporated, San Diego, CA (US)

(72) Inventors: Chulmin Jung, San Diego, CA (US);
David Li, San Diego, CA (US);
Po-Hung Chen, Los Angeles, CA (US);
Ayan Paul, San Diego, CA (US);
Derek Yang, Poway, CA (US);
Chun-Yen Lin, Taoyuan Dist (TW)

(73) Assignee: QUALCOMM INCORPORATED, San Diego, CA (US)

( * ) Notice: Subject to any disclaimer, the term of this patent is extended or adjusted under 35 U.S.C. 154(b) by 340 days.

(21) Appl. No.: 18/104,167

(22) Filed: Jan. 31, 2023

(65) Prior Publication Data
US 2024/0257868 A1      Aug. 1, 2024

(51) Int. Cl.
*G11C 7/02*      (2006.01)
*G11C 11/419*    (2006.01)

(52) U.S. Cl.
CPC .................. *G11C 11/419* (2013.01)

(58) Field of Classification Search
CPC .................................................... G11C 11/419
USPC ........................................................ 365/207
See application file for complete search history.

(56) References Cited

U.S. PATENT DOCUMENTS

| | | | | |
|---|---|---|---|---|
| 5,436,492 A * | 7/1995 | Yamanaka | ............ | H01L 23/057 257/702 |
| 5,572,715 A | 11/1996 | Gowni | | |
| 5,774,411 A * | 6/1998 | Hsieh | ..................... | G11C 11/419 365/204 |
| 5,796,651 A * | 8/1998 | Horne | ....................... | G11C 8/08 365/189.11 |
| 5,914,903 A * | 6/1999 | Kanma | ..................... | G11C 7/12 365/185.11 |
| 6,249,471 B1 | 6/2001 | Roy | | |
| 6,462,584 B1 | 10/2002 | Proebsting | | |
| 6,710,656 B2 | 3/2004 | Jaussi | | |
| 7,310,755 B2 | 12/2007 | Mudge et al. | | |
| 7,679,405 B2 | 3/2010 | Wilson | | |
| 7,684,274 B2 * | 3/2010 | Rengarajan | ............... | G11C 7/02 365/207 |
| 7,830,727 B2 * | 11/2010 | Arsovski | ............... | G11C 11/413 365/204 |
| 7,834,663 B2 | 11/2010 | Wendell | | |
| 8,064,275 B2 * | 11/2011 | Houston | ............... | G11C 11/413 365/228 |
| 8,582,379 B2 * | 11/2013 | Cheng | .................... | G11C 7/067 365/203 |

(Continued)

OTHER PUBLICATIONS

International Search Report and Written Opinion—PCT/US2024/011902—ISA/EPO—Apr. 26, 2024.

*Primary Examiner* — Viet Q Nguyen
(74) *Attorney, Agent, or Firm* — Loza & Loza, LLP (57) ABSTRACT

A memory is provided with a pseudo-differential sense amplifier for single-endedly sensing a first read bit line from a first bank of bitcells. The sense amplifier compares a voltage of the first read bit line to a voltage of a pre-charged second read bit line from a second bank of bitcells to make a bit decision for a read operation through the first read bit line to the first bank of bitcells.

21 Claims, 6 Drawing Sheets

(56) References Cited

U.S. PATENT DOCUMENTS

| | | | | |
|---|---|---|---|---|
| 8,611,128 B2* | 12/2013 | Pelley | G11C 17/18 | 365/207 |
| 8,625,373 B2* | 1/2014 | Schreiber | G11C 7/065 | 365/205 |
| 8,638,621 B2* | 1/2014 | Son | G11C 11/419 | 365/207 |
| 8,848,419 B2* | 9/2014 | Wu | G11C 7/14 | 365/189.05 |
| 8,982,610 B2* | 3/2015 | Harris | G11C 7/12 | 365/205 |
| 9,064,556 B2* | 6/2015 | Gulati | G11C 7/1075 | |
| 9,406,351 B2* | 8/2016 | Stansfield | G11C 11/419 | |
| 10,319,425 B1* | 6/2019 | Jung | G11C 7/24 | |
| 10,607,033 B2* | 3/2020 | Kuenemund | G11C 11/412 | |
| 11,557,336 B2* | 1/2023 | Yang | G11C 11/419 | |
| 11,955,169 B2* | 4/2024 | Raj | G11C 11/412 | |
| 11,984,151 B2* | 5/2024 | Rawat | G11C 7/12 | |
| 2009/0147605 A1* | 6/2009 | Rengarajan | G11C 7/062 | 365/210.14 |
| 2011/0305099 A1* | 12/2011 | Sharma | G11C 7/12 | 365/203 |
| 2012/0069636 A1* | 3/2012 | Pelley | G11C 11/413 | 365/210.1 |
| 2013/0076424 A1 | 3/2013 | Mohammad et al. | | |
| 2013/0148452 A1 | 6/2013 | Schreiber | | |
| 2014/0112064 A1* | 4/2014 | Adams | G11C 7/12 | 365/154 |
| 2015/0294697 A1 | 10/2015 | Jung et al. | | |
| 2020/0135260 A1 | 4/2020 | Venkata | | |
| 2022/0139452 A1* | 5/2022 | Yang | G11C 7/222 | 365/154 |
| 2022/0310156 A1* | 9/2022 | Raj | G11C 11/412 | |

* cited by examiner

PSEUDO-DIFFERENTIAL DE-GLITCH SENSE AMPLIFIER

TECHNICAL FIELD

This application relates to sense amplifiers, and more particularly to a pseudo-differential de-glitch sense amplifier.

BACKGROUND

A traditional static random-access memory (SRAM) bitcell has a common read and write port (a single port) formed by a pair of bit lines and a corresponding pair of access transistors. This single port access can be problematic in a modern multi-core processor as the multiple processors must then share the single port. A single-port bitcell can function as a pseudo-multi-port bitcell if the single port is clocked in a "double pumped" fashion in which a single memory clock cycle includes a read port access time and a separate write port access time. But a true multi-port bitcell offers faster access times as the read and write port access can occur simultaneously. Thus, various multi-port SRAM bitcell architectures have been developed.

In one type of multi-port SRAM, a multi-port bitcell has a write port accessed through a pair of write bit lines and a single read port accessed through a corresponding single read bit line. In another type of multi-port SRAM, a multi-port bitcell has a write port accessed through a pair of write bit lines, a first read port accessed through a first read bit line, and a second read port accessed through a second read port. The use of just one read bit line per read port in a multi-port bitcell typically requires the use of a single-ended sense amplifier, which slows the access speed.

SUMMARY

In accordance with an aspect of the disclosure, a sense amplifier is provided that includes: a first transistor coupled to a node for a first bit decision signal; a first read bit line coupled to a first bank of bitcells and to a gate of the first transistor; a second transistor coupled between the first transistor and ground; and a node for a complement of a pre-charge signal.

In accordance with another aspect of the disclosure, a method of operation for a sense amplifier is provided that includes: switching on a first switch responsive to a charged state of a first read bit line during a read operation to a first bank of bitcells, wherein the first switch is coupled between a node for a first bit decision signal and ground; switching on a second switch during the read operation to the first bank of bitcells, wherein the second switch is coupled in parallel with the first switch between the node for the first bit decision signal and ground, to cause the first bit decision signal to discharge to ground at a first rate; and switching on a third switch during the read operation to the first bank of bitcells wherein the switching of the third switch is responsive to a pre-charging of a second read bit line to a second bank of bitcells and the third switch is coupled between a node for a second bit decision signal and ground, to cause the second bit decision signal to discharge at a second rate that is less than the first rate In accordance with yet another aspect of the disclosure, a memory is provided that includes: a node for a first bit decision signal; a first read bit line; a first switch coupled to the node for the first bit decision signal, wherein the first switch is configured to close responsive to a charged state of the first read bit line; a second switch coupled between the first switch and ground, wherein the second switch is configured to close responsive to a charged state of the first read bit line; and a third switch coupled in parallel with the second switch between the first switch and ground, wherein the third switch is configured to close during a read operation in which the first read bit line is coupled to a first bank of bitcells.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

A traditional single-port SRAM bitcell is sensed through a pair of bit lines by a differential sense amplifier. Depending upon the binary value stored in the single-port SRAM bitcell, one of the bit lines in the bit line pair will begin to discharge whereas another one of the bit lines remains charged. As one bit line discharges, the differential sensing tends to support the charging of the remaining bit line. Similarly, the charged state of one bit line supports the discharge of the other bit line. In contrast, the sensing of a single read bit line from a memory bank is fundamentally a single-ended sensing. For example, an inverter could be used for such sensing. Depending upon whether a read bit line voltage was higher or lower than a threshold voltage for the inverter, a single-ended bit sensing may be performed accordingly. But such a single-ended sensing is relatively slow as compared to a differential sensing as there is no assistance from a complementary bit line.

The relative slow speed of single-ended sensing is thus a problem for multi-port SRAMs as the read bit lines are not arranged in complementary pairs as occurs for a traditional single-port SRAM. To provide improved performance, a differential sense amplifier is disclosed that compares the voltage of an active read bit line to a pre-charged reference read bit line. The resulting sensing is thus "pseudo-differential" in that the active read bit line being sensed is not necessarily in a complementary binary state to the reference read bit line. For example, suppose that the accessed multi-port bitcell coupled to the read bit line is storing a binary one (the following discussion will assume that an active-high binary convention is used although the pseudo-differential sense amplifier disclosed herein may also be used in memories with an active-low binary convention). Prior to the read operation, both the active read bit line and the reference read bit line are pre-charged by being charged to a memory power supply voltage. A binary one being stored in the accessed multi-port bitcell then causes the active read bit line to maintain its charged state after the corresponding word line is asserted to couple the active read bit line to the accessed multi-port bitcell.

Should the active read bit line thus be charged during a read operation, the pseudo-differential sense amplifier is comparing an active read bit line that is charged to the memory power supply voltage to a reference read bit line that is also charged to the memory power supply voltage. Such a comparison will lead to an unpredictable result in a conventional differential sense amplifier—it would depend on the imbalances and noise in the differential sense amplifier as to whether the differential sense amplifier would resolve the binary-one-to-binary-one comparison into a binary one or a binary zero result for the read operation. For this reason, a traditional multi-port memory used a single-ended sense amplifier at the cost of reduced operating speed. But this is solved herein due to an advantageous selective application of an offset in the pseudo-differential sense amplifier as further explained herein.

Figure 1:
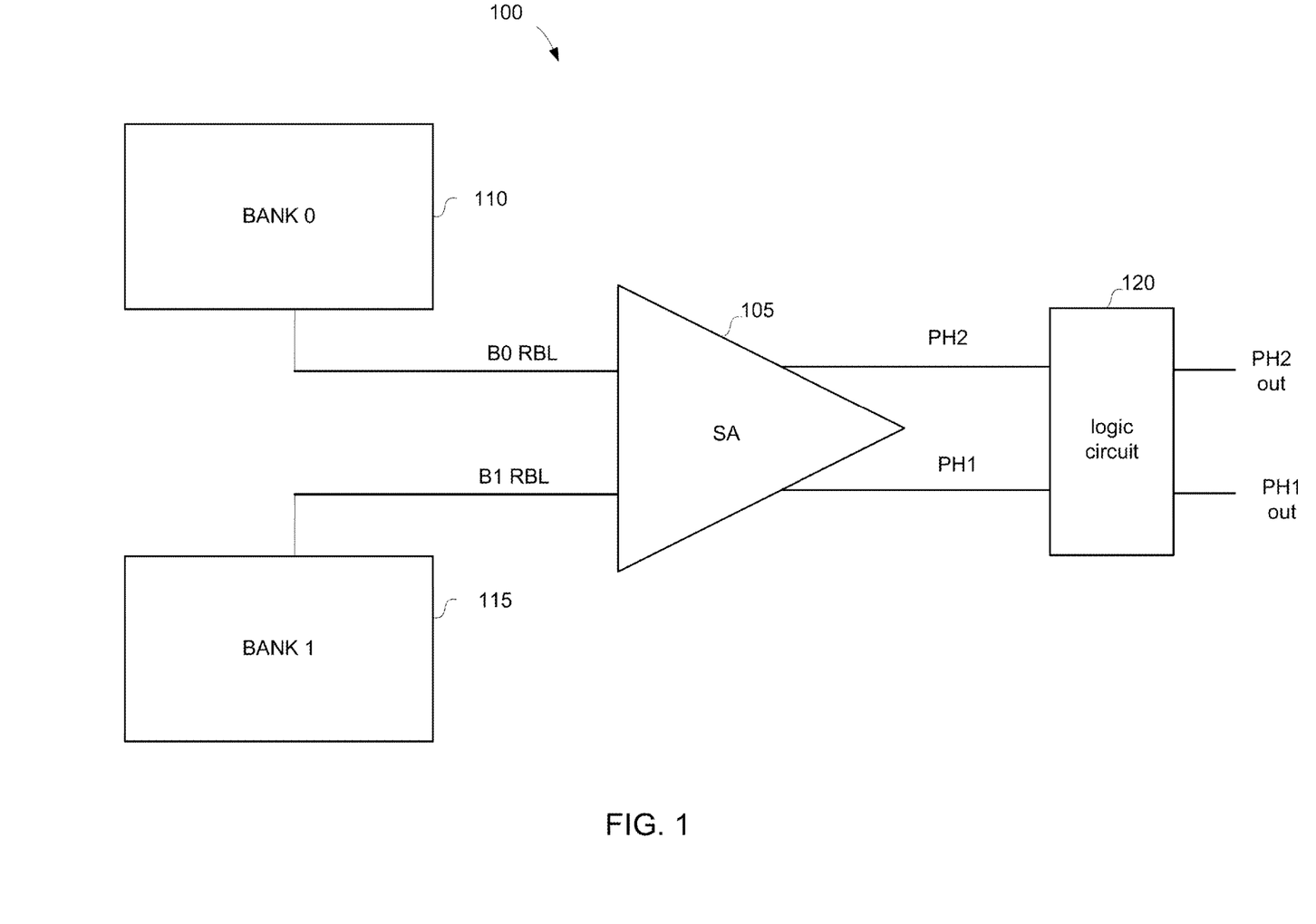
FIG. 1 is a diagram of a memory including a pseudo-differential sense amplifier in accordance with an aspect of the disclosure.

Turning now to the drawings, an example memory 100 with a pseudo-differential sense amplifier 105 is shown in FIG. 1. Pseudo-differential sense amplifier 105 compares a bank 0 (B0) read bit line from a zeroth bank 110 of multi-port bitcells to a bank 1 (B1) read bit line from a first bank 115 of multi-port bitcells to drive a pair of complementary bit decision signals PH1 and PH2. The zeroth bank 110 is also denoted herein as a first bank whereas the first bank 115 is also denoted as a second bank. Similarly, the bank 0 read bit line is also denoted herein as a first read bit line whereas the bank 1 read bit line is also denoted as a second read bit line. The multi-port bitcells in each bank 110 and 115 are arranged into rows and columns. Each row is traversed with a corresponding word line (not illustrated) and each column by a corresponding read bit line. The number of read bit lines per column of multi-port bitcells depends upon the number of read ports supported by the multi-port bitcells. In one implementation, there is just one read port per multi-port bitcell such that there would be only one read bit line per column. In another implementation, there are two read ports per multi-port bitcell such that there would be two read bit lines per column. For the zeroth bank 110, the B0 read bit line traverses a corresponding column of multi-port bitcells and couples to a corresponding read port. Should memory 100 have only one read port per multi-port bitcell, the B0 read bit line would couple to this read port for the multi-port bitcell at the intersection of the column and the accessed row. If memory 100 has two read ports per multi-port bitcell, the B0 read bit line would couple to one of these read ports for the multi-port bitcell at the intersection of the column and the accessed row. The B1 read bit line in the first bank 115 is arranged analogously as discussed for the B0 read bit line.

As defined herein, a "bank" of multi-port bitcells corresponds to a contiguous array of multi-port bitcells arranged into rows and columns. The advantage of dividing memory 100 into banks such as banks 110 and 115 is that the read bit line capacitance is reduced. In contrast, note that if banks 110 and 115 were instead combined into a single bank, the resulting read bit lines would be twice as long as the B0 and B1 read bit lines. This increase in length would correspond to an increase in read bit line capacitance, which may slow memory operating speed.

Prior to a read operation to memory 100, both the B0 read bit line and the B1 read bit line are pre-charged to the memory power supply voltage. During the read operation to memory 100, one of banks 110 and 115 is the accessed bank where the remaining bank is the reference bank. For example, suppose that the read operation is to the zeroth bank 110. Depending upon the binary content of the accessed multi-port bitcell in the zeroth bank 110 that couples to the B0 read bit line, the B0 read bit line will either be maintained at the memory power supply voltage or begin to discharge towards ground. In contrast, the B1 read bit line stays pre-charged during the read operation since the first bank 115 would then be the reference bank.

Figure 2:
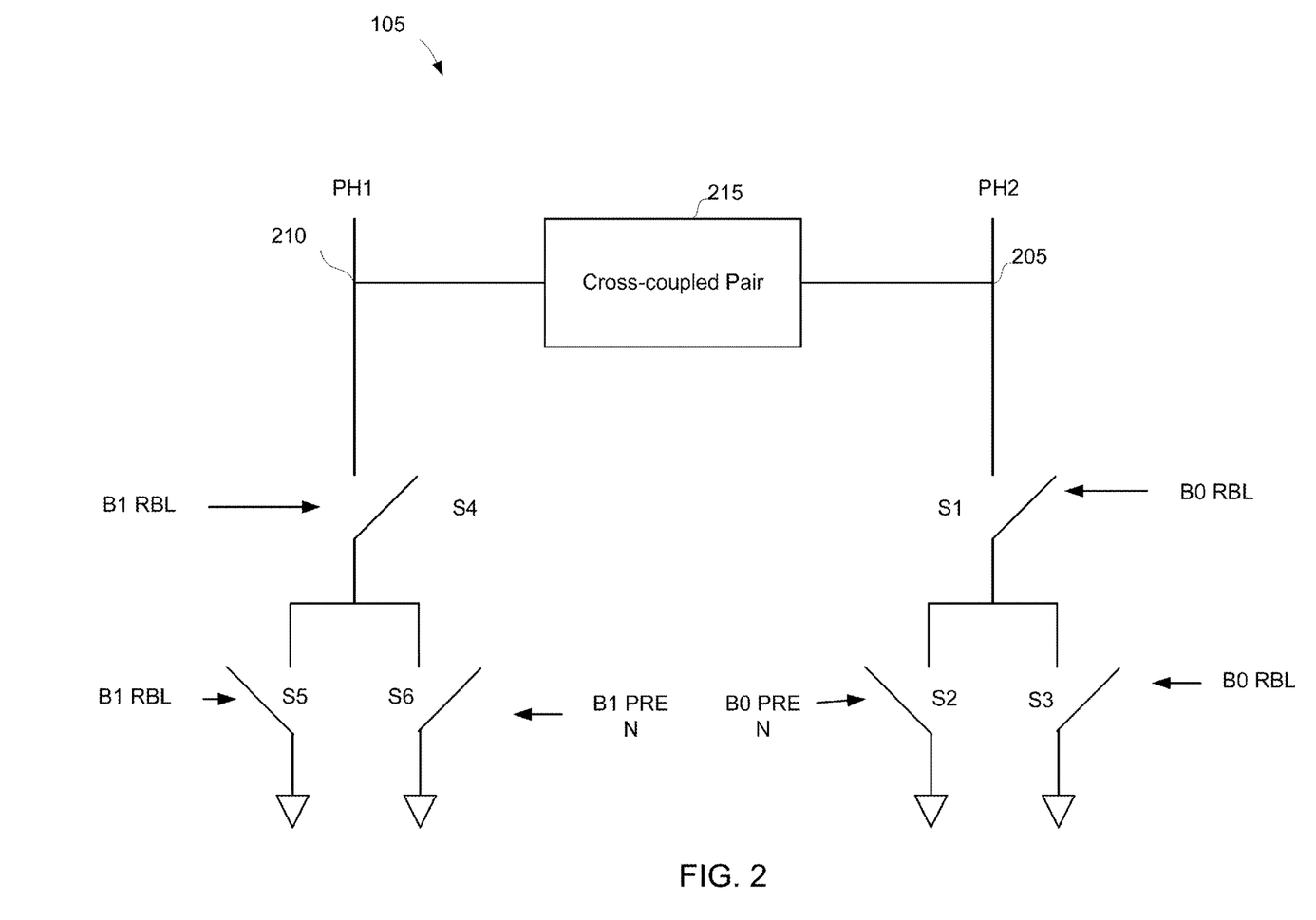
FIG. 2 is a diagram of a pseudo-differential sense amplifier in accordance with an aspect of the disclosure.

Referring now to FIG. 2, pseudo-differential sense amplifier 105 is shown in more detail. A switch S1 couples between a node 205 for the PH2 bit decision signal and a pair of switches S2 and S3. Switches S2 and S3 couple in parallel between switch S1 and ground. Switch S1 is also denoted herein as a first switch whereas switches S3 and S2 are denoted as a second switch and a third switch, respectively. Similarly, a switch S4 couples between a node 210 for the PH1 bit decision signal and a pair of switches S5 and S6. Switches S5 and S6 couple in parallel between switch S4 and ground. Switch S4 is also denoted herein as a fourth switch whereas switches S6 and S5 are denoted as a fifth switch and a sixth switch, respectively. Each switch S1 through S6 is configured to close when a corresponding control signal is true and to open when the corresponding control signal is false. The control signal for switches S1 and S3 is the voltage of the B0 read bit line (RBL). Similarly, the control signal for switches S4 and S5 is the voltage of the B1 read bit line.

A signal that is true when the zeroth bank 110 is the active (accessed) bank during a read operation controls switch S2. An example of such a signal is a complement of (B0 PRE N) of a precharge signal for the B0 read bit line (or for the zeroth bank 110 generally). Prior to the read operation, the B0 read bit line is precharged such that the B0 PRE N signal is false. But during a read operation to the zeroth bank 110, the B0 PRE N signal is true to stop the pre-charging, which causes switch S2 to close. Should the accessed multi-port bitcell be storing a binary one, the B0 read bit line voltage will be asserted to the power supply voltage such that both switches S1 and S3 are closed. Prior to the read operation, node 205 is pre-charged such that the bit decision signal PH2 is pre-charged to the memory power supply voltage. The switching on of switches S1 and S3 will then act to discharge the bit decision signal PH2 towards ground. But this discharge is accelerated by the closing of switch S2 since switches S2 and S3 are in parallel. The inclusion of switch S2 as controlled by the B0 PRE N signal thus acts to provide an offset in pseudo-differential sense amplifier 105 that bolsters or strengthens a binary one state for the read bit line of the accessed bank. Switch S6 stays open during a read operation to the zeroth bank 110 and will only close during a read operation to the first bank 115.

A similar offset exists for a sensing of the B1 read bit line when the first bank 115 is the active bank and the accessed multi-port bitcell is storing a binary one. Prior to the read operation, the read bit lines and the nodes 210 and 205 for the bit decision signals are pre-charged. The bit decision signal PH1 will thus be pre-charged to the memory power supply voltage prior to the read operation. With the accessed multi-port bitcell storing a binary one, switches S4 and S5 are on and functioning to discharge the bit decision signal PH1 toward ground. This discharge is accelerated by the closing of switch S6 since switches S5 and S6 are in parallel.

Should the sensed read bit line be coupled to a multi-port bitcell that is storing a binary zero, the sensed read bit line will discharge towards ground during the read operation. For example, suppose that the zeroth bank 110 is the active bank and that the accessed multi-port bitcell is storing a binary zero. Switch S2 will be closed during the read operation but the bit decision signal PH2 is not substantially discharged by this because switch S1 couples between switch S2 and the node 205 for the bit decision signal 205. As the B0 read bit line discharges, switch S1 will begin to open and thus prevent switch S2 from discharging the bit decision signal PH2.

To provide additional gain, nodes 205 and 210 couple to a cross-coupled pair of transistors 215 as will be further explained herein. With this additional gain, an imbalance in the voltages between nodes 205 and 210 as caused by the read operation can quickly be resolved into a bit decision. For example, if the zeroth bank 110 is the accessed bank and the accessed multi-port bitcell is storing a binary one, the bit decision signal PH2 will tend to discharge more strongly than the discharge of the bit decision signal PH1 due to the offset provided by switch S2 as controlled by the B0 PRE N signal. Without this offset, both the active read bit line and the reference read bit line (in this example, the B0 read bit line and the B1 read bit line, respectively) would tend to discharge their respective bit decision signal equally as both read bit lines maintain their charged state during the read operation. But switch S2 functions to strengthen the binary one state of the B0 read bit line as compared to the binary one state of the B1 read bit line state An analogous "binary one state strengthening" occurs for a read operation to the first bank 115 when the accessed multi-port bitcell is storing a binary one.

During a read operation to the zeroth bank 110, it can thus be seen that if the accessed multi-port bitcell is storing a binary one, the bit decision signal PH2 will be discharged whereas the bit decision signal PH1 will remain charged to the memory power supply voltage. But this complementary state for the bit decision signals is reversed during a read operation to the first bank 115. In that case, if the accessed multi-port bitcell in the first bank 115 is storing a binary one, it is the bit decision signal PH1 that is discharged to ground. The same opposition occurs when the accessed multi-port bitcell is storing a binary zero. In that case, it is the PH1 signal that is discharged when it is the zeroth bank 110 that is active whereas it is the PH2 signal that is discharged when it is the first bank 115 that is active. Referring again to FIG. 1, memory 100 includes a logic circuit 120 that processes the bit decision signals PH1 and PH2 depending upon which bank was active to provide a consistent complementary binary state for a pair of output bit decision signals PH1 out and PH2 out. It is arbitrary what this consistent complementary binary state is but in the following discussion it will be assumed that if the accessed multi-port bitcell is storing a binary one, then it is the PH1 out signal that is discharged. Conversely, if the accessed multi-port bitcell is storing a binary zero, then it is the PH2 out signal that is discharged.

Figure 3:
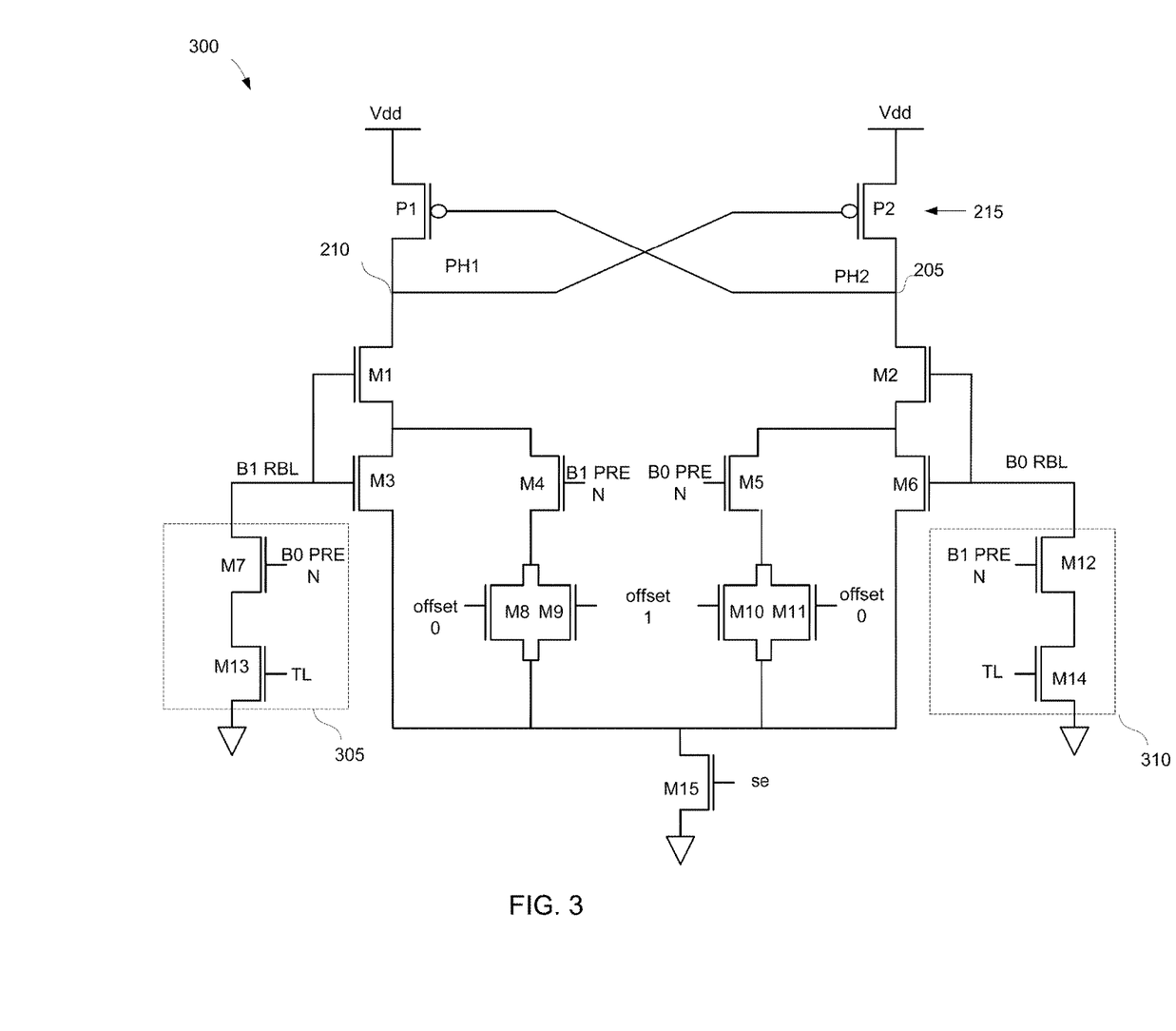
FIG. 3 is a circuit diagram of a pseudo-differential sense amplifier in accordance with an aspect of the disclosure.

An example pseudo-differential sense amplifier 300 is shown in more detail in FIG. 3. An n-type metal-oxide-semiconductor (NMOS) transistor M1 has a drain coupled to the node 210 for the PH1 signal and has a source connected to a drain of an NMOS transistor M3 having a source coupled to ground through an NMOS sense enable transistor M15. The B1 read bit line couples to the gates of transistors M1 and M3. During a read operation, a sense enable (se) signal is asserted that drives the gate of the sense enable transistor M15 to switch transistor M15 on. It may thus be seen that transistor M1 is an example implementation of switch S4 whereas transistor M3 is an example implementation of switch S5.

An NMOS transistor M4 has a drain coupled to the source of transistor M1 and a source coupled to the drains of a pair of NMOS transistors M8 and M9. The sources of transistors M8 and M9 couple to ground through transistor M15. An offset tuning signal offset 0 drives the gate of transistor M8 whereas an offset tuning signal offset 1 drives the gate of transistor M9. The B1 PRE N signal drives the gate of transistor M4. It may thus be seen that transistor M4 is an example implementation of switch S6. So that switch S6 can provide an offset (strengthen a binary one state for the B1 read bit line), at least one of the offset tuning signals offset 0 and offset 1 is asserted (true). In this fashion, transistor M4 and the switched-on one of transistors M8 and M9 can function to assist the discharge of node 210 when the first bank 115 is active and the accessed multi-port bitcell is storing a binary one value. If both offset tuning signals offset 0 and offset 1 are true, the offset is strengthened whereas the offset is reduced if only one of these signals is true. In this fashion, the offset provided by transistor M4 can be tuned. In that regard, it will be appreciated that a strong offset increases the operating speed with respect to sensing the binary one value of the accessed multi-port bitcell. But if the offset is too strong, pseudo-differential sense amplifier 300 could have a bit error or glitch with respect to sensing a binary zero value for the accessed multi-port bitcell. It will thus be appreciated that transistors M8 and M9 provide an ability to optimize performance with respect to operation speed without incurring bit errors or glitches.

An NMOS transistor M2 has a drain coupled to the node 205 for the PH2 signal and has a source connected to a drain of an NMOS transistor M6 having a source coupled to ground through the sense enable transistor M15. The B0 read bit line couples to the gates of transistors M2 and M6. It may thus be seen that transistor M2 is an example implementation of switch S1 whereas transistor M6 is an example implementation of switch S3.

An NMOS transistor M5 has a drain coupled to the source of transistor M2 and a source coupled to the drains of a pair of NMOS transistors M10 and M11. The sources of transistors M10 and M11 couple to ground through the sense enable transistor M15. The offset tuning signal offset 0 drives the gate of transistor M11 whereas the offset tuning signal offset 1 drives the gate of transistor M10. The B0 PRE N signal drives the gate of transistor M5. It may thus be seen that transistor M5 is an example implementation of switch S2. The offset signals 0 and 1 control which one (or both) of transistors M10 and M11 are switched on to control the offset strength provided by transistor M5 when the zeroth bank 110 is active.

A p-type metal-oxide semiconductor (PMOS) transistor P1 and a PMOS transistor P2 form the cross-coupled pair of transistors 215. The sources of transistors P1 and P2 couple to a power supply node for the memory power supply voltage Vdd. The drain of transistor P1 couples to node 210 and the drain of transistor M1. Similarly, the drain of transistor P2 couples to node 205 and the drain of transistor M2. Node 210 couples to the gate of transistor P2 whereas node 205 couples to the gate of transistor P1 to form the cross-coupling between transistors P1 and P2. The resulting cross-coupled pair of transistors 215 function to boost the gain of pseudo-differential sense amplifier 300. For example, if the first bank 115 is active and the sensed bitcell is storing a binary one, the voltage of node 210 will decrease faster than the voltage of node 205 due to the offset provided by transistor M4. This reduced voltage at node 210 functions to switch on transistor P2, which maintains the charge of the bit decision signal PH2. In turn, the charged state of the bit decision signal PH2 keeps transistor P1 off so that the bit decision signal PH1 may be quickly discharged through transistors M1, M3, M4, M15 and one of (or both) of transistors M8 and M9. In this fashion, a bitcell value of a binary one value read from the first bank 115 results in the bit decision signal PH1 being a binary zero and the bit decision signal PH2 being a binary one. Should the bit being sensed from the first bank 115 instead be a binary zero, the falling voltage of the B1 read bit line will tend to switch off transistors M1 and M3, which prevents the boosting from the switching on of transistor M4 from discharging node 210. The bit decision signal PH1 thus remains charged to the memory power supply voltage Vdd. In contrast, the bit decision signal PH2 discharges. A bitcell value of a binary zero sensed from the first bank 115 thus results in the bit decision signal PH1 being a binary one and the bit decision signal PH2 being a binary zero.

The bit decision signal PH2 is also denoted herein as a first bit decision signal whereas the bit decision signal PH1 is denoted as a second bit decision signal. Transistor M2 is also denoted as a first transistor. Similarly, transistor M5 is also denoted as a second transistor. Transistor M6 is also denoted as a third transistor. Transistor M1 is also denoted as a fourth transistor. Transistor M4 is also denoted as a fifth transistor. Transistor M3 is also denoted as a sixth transistor. Transistor P1 is also denoted as a first cross-coupled transistor. Similarly, transistor P2 is also denoted as a second cross-coupled transistor.

The sensing of a bit from the zeroth bank 110 by pseudo-differential sense amplifier 300 will now be discussed. Should the accessed bitcell in the zeroth bank 110 be storing a binary zero, the falling voltage on the B0 read bit line during the read operation will tend to switch off transistors M2 and M6, which prevents transistor M5 from discharging the bit decision signal PH2 at node 205. In contrast, the charged state of the B1 read bit line will keep transistors M1 and M3 on to discharge more strongly the bit decision signal PH1 at node 210. Transistor P2 will thus switch on to maintain the charge of the PH2 signal while transistor P1 remains off to allow the PH1 signal to discharge. The PH2 signal will thus be asserted when a binary zero is sensed from the zeroth bank 110 whereas the PH1 signal will be discharged. Conversely, if the accessed bitcell in the zeroth bank 110 is storing a binary one, transistor M5 functions to assist the discharge of the PH2 signal, which maintains transistor P1 on so that the PH1 signal is maintained high (charged to the memory power supply Vdd). The PH1 signal will thus be asserted when a binary one is sensed from the zeroth bank 110 whereas the PH2 signal will be discharged.

It may thus be seen that the complementary states of the PH1 and PH2 signals are reversed depending upon whether a given bit value (either a binary zero or a binary one) is being read from the zeroth bank 110 or the first bank 115. Referring again to memory 100, logic circuit 120 functions to provide a consistent complementary state for the set of output signals PH1 out and PH2 out regardless of which bank has been active and which bank was the reference bank. An example implementation 400 of the logic circuit 120 is shown in more detail in FIG. 4. A group of PMOS transistors P3, P4, P5, and P6 all have their sources coupled to a node for the power supply voltage Vdd. A drain of transistor P3 couples to a source of a PMOS transistor P7 that has a drain coupled to an output node 405 for producing the output signal PH2 out. A drain of transistor P4 couples to a source of a PMOS transistor P8 that also has a drain coupled to the output node 405. A serial pair of NMOS transistors M16 and M18 couple between the output node 405 and ground. The PH2 signal drives a gate of transistor M16 whereas the PH1 signal drives a gate of transistor M18. Transistors M16 and M18 are thus switched on during a pre-charge prior to a read operation when both the PH1 and the PH2 signals are pre-charged. In this fashion, the PH2 out signal at node 405 is reset to zero prior to a read operation.

Figure 4:
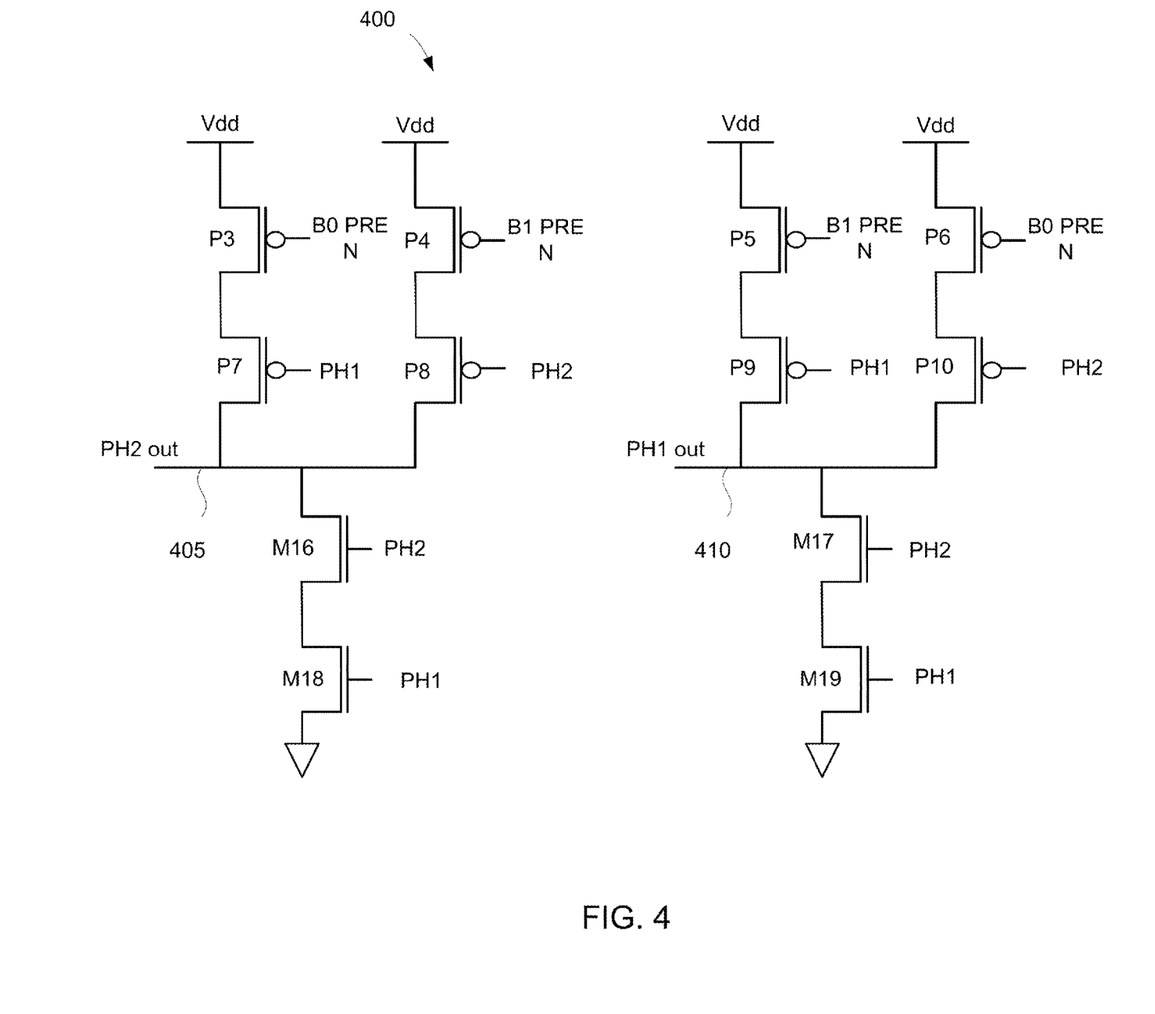
FIG. 4 is a circuit diagram of an output logic circuit for a pseudo-differential sense amplifier in accordance with an aspect of the disclosure.

The B0 PRE N signal drives a gate of transistor P3. Transistor P3 is thus only on when the first bank 115 is active. The PH1 signal drives a gate of transistor P7. Thus, transistors P3 and P7 are on when the first bank 115 is active and the sensed bit is a binary one. When a binary one is sensed from the first bank 115, the PH2 out signal at node 405 will thus be asserted to the power supply voltage Vdd. Similarly, the B1 PRE N signal drives a gate of transistor P4 so that transistor P4 is only on when the zeroth bank 110 is active. The PH2 signal drives a gate of transistor P8 such that both transistors P4 and P8 are on when a binary one is sensed from the zeroth bank 110. When a binary one is sensed from the zeroth bank 110, the PH2 out signal at node 405 will thus be asserted to the power supply voltage Vdd. The assertion of the PH2 out signal is thus consistent for a sensing of a binary one regardless of whether it is sensed from the zeroth bank 110 or from the first bank 115.

A drain of transistor P5 couples to a source of a PMOS transistor P9 that has a drain coupled to an output node 410 for producing the output signal PH1 out. A drain of transistor P6 couples to a source of a PMOS transistor P10 that also has a drain coupled to the output node 410. A serial pair of NMOS transistors M17 and M19 couple between the output node 410 and ground. The PH2 signal drives a gate of transistor M17 whereas the PH1 signal drives a gate of transistor M19. Transistors M17 and M19 are thus switched on during a pre-charge prior to a read operation when both the PH1 and the PH2 signals are pre-charged. In this fashion, the PH1 out signal at output node 410 is reset to zero prior to a read operation.

The B1 PRE N signal drives a gate of transistor P5. Transistor P5 is thus only on when the zeroth bank 110 is active. The PH1 signal drives a gate of transistor P9. Thus, transistors P5 and P9 are on when the zeroth bank 110 is active and the sensed bit is a binary zero. When a binary zero is sensed from the zeroth bank 110, the PH1 out signal at node 410 will thus be asserted to the power supply voltage Vdd. Similarly, the B0 PRE N signal drives a gate of transistor P6 so that transistor P6 is only on when the first bank 115 is active. The PH2 signal drives a gate of transistor P10 such that both transistors P6 and P10 are on when a binary zero is sensed from the first bank 115. When a binary zero is sensed from the first bank 110, the PH1 out signal at node 410 will thus be asserted to the power supply voltage Vdd. The assertion of the PH1 out signal is thus consistent for a sensing of a binary zero regardless of whether it is sensed from the zeroth bank 110 or from the first bank 115.

The PH2 out and PH1 out signals are complements of each other during a read operation. For example, as noted above the PH2 out signal is asserted when a binary one signal is sensed from either of the zeroth bank 110 or from the first bank 115. In such a case, the PH1 signal will be a binary one if the zeroth bank 110 is active such that transistor P9 is off. Similarly, the PH2 signal will be a binary one if the first bank is active such that transistor PH2 is off.

The PH1 out signal will thus be a binary zero when the PH2 out signal is asserted for the sensing of a binary one. Similarly, the PH2 out signal will be discharged when the PH1 out signal is asserted for the sensing of a binary zero.

Referring again to pseudo-differential sense amplifier 300, suppose that a read access occurs through the B0 read bit line. A word line (not illustrated) will thus be asserted that couples to the accessed bitcell. This word line drives the gate of an access transistor in the accessed bitcell that couples between an input node to one of the bitcell's cross-coupled inverters (not illustrated) and the B0 read bit line. There is thus a capacitive coupling between the toggling (assertion) of the word line voltage and the B0 read bit line. To provide a similar capacitive coupling to the reference read bit line (in this example, the B1 read bit line), the B1 read bit line couples to a word line coupling mimicking circuit 305 that includes a serial combination of an NMOS transistor M7 and an NMOS transistor M13 coupled between ground and the B1 read bit line. The B0 PRE N signal drives a gate of transistor M7 whereas a grounded (tied low (TL)) signal drives the gate of transistor M13. During a read operation to the zeroth bank 110, the B0 PRE N signal will then be asserted to the memory power supply voltage Vdd. This assertion of the B0 PRE N signal couples through the gate-to-drain parasitic capacitance of transistor M7 to provide a capacitive coupling to the B1 read bit line that mimics the capacitive coupling from the word line assertion to the B0 read bit line. In this fashion, the word line coupling to the B0 read bit line does not affect the bit sensing operation. Although transistor M7 will tend to switch on, transistor M13 remains off to prevent the discharge of the B1 read bit line.

A similar capacitive coupling occurs to the B1 read bit line when it is accessed during a read operation to the first bank 115. The B0 read bit line thus couples to a word line coupling mimicking circuit 310 formed by a serial combination of an NMOS transistor M12 and an NMOS transistor M14 that couple between the B0 read bit line and ground. The B1 PRE N signal drives the gate of transistor M12 whereas the TL signal drives the gate of transistor M14. During a read operation through the B1 read bit line, the B1 PRE N signal will thus be asserted and capacitively couple through the gate-to-drain parasitic capacitance of transistor M12 to the reference read bit line (in this example, the B0 read bit line). The B0 read bit line does not discharge since transistor M14 remains off.

Word line coupling mimicking circuit 310 is also denoted herein as a first word line coupling mimicking circuit. Similarly, word line coupling mimicking circuit 305 is also denoted herein as a second word line coupling mimicking circuit. Transistor M12 is also denoted herein as a seventh transistor whereas transistor M14 is denoted as an eighth transistor. Transistor M7 is also denoted as a ninth transistor whereas transistor M13 is denoted as a tenth transistor.

Figure 5:
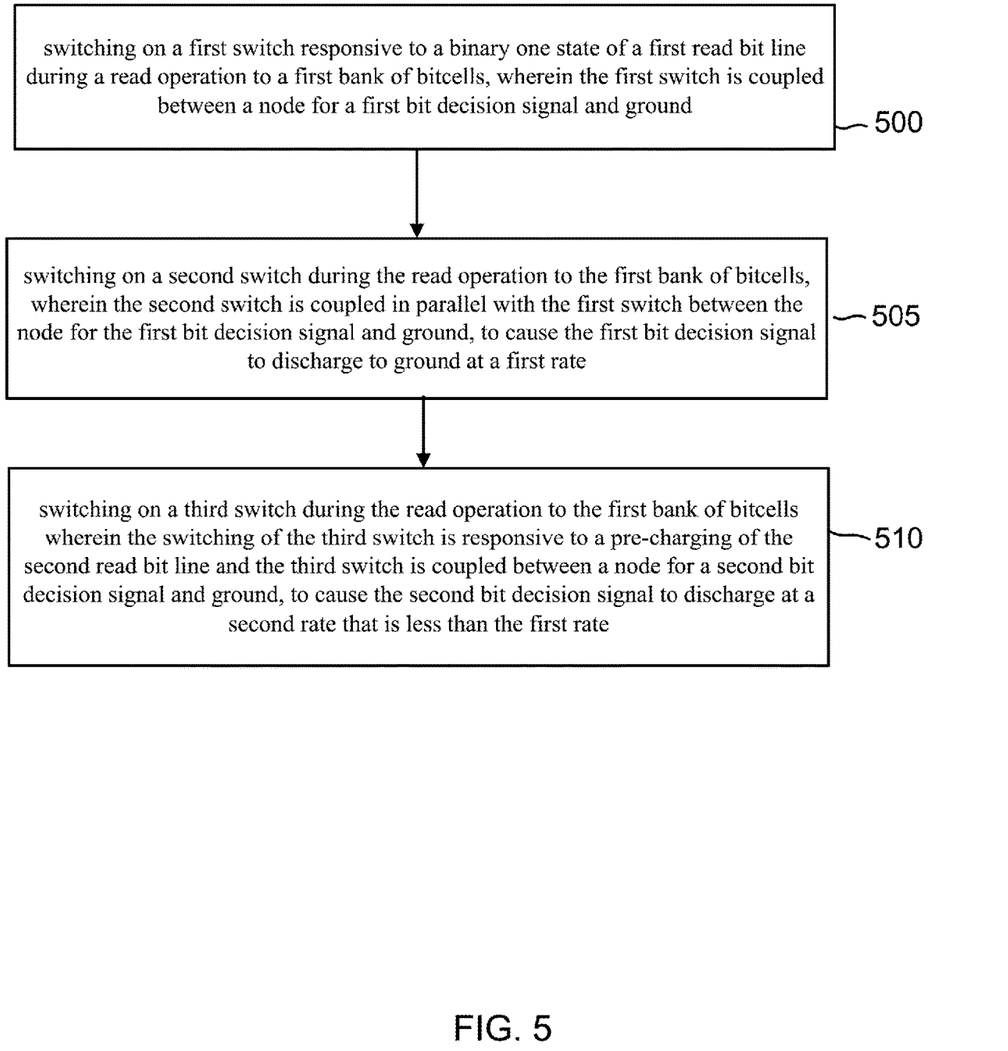
FIG. 5 is a flowchart of an example method of operation for a pseudo-differential sense amplifier in accordance with an aspect of the disclosure.

A method of pseudo-differentially sensing a read bit line will now be discussed with respect to the flowchart of FIG. 5. The method includes an act 500 of switching on a first switch responsive to a charged state of a first read bit line during a read operation to a first bank of bitcells, wherein the first switch is coupled between a node for a first bit decision signal and ground. The switching on of switch S3 in sense amplifier 100 and the switching on of transistor M6 in sense amplifier 300 both while the B0 read bit line is coupled to a bitcell storing a binary one value is an example of act 500. The method also includes an act 505 of switching on a second switch during the read operation to the first bank of bitcells, wherein the second switch is coupled in parallel with the first switch between the node for the first bit decision signal and ground, to cause the first bit decision signal to discharge to ground at a first rate. The switching on of switch S2 in sense amplifier 100 or of transistor M5 in sense amplifier 300 is an example of act 505. Finally, the method includes an act 510 of switching on a third switch during the read operation to the first bank of bitcells wherein the switching of the third switch is responsive to a pre-charging of a second read bit line to a second bank of bitcells and the third switch is coupled between a node for a second bit decision signal and ground, to cause the second bit decision signal to discharge at a second rate that is less than the first rate. The switching on of switch S5 in sense amplifier 100 and the switching on of transistor M3 both while the first bank 115 is the reference bank is an example of act 510.

Figure 6:
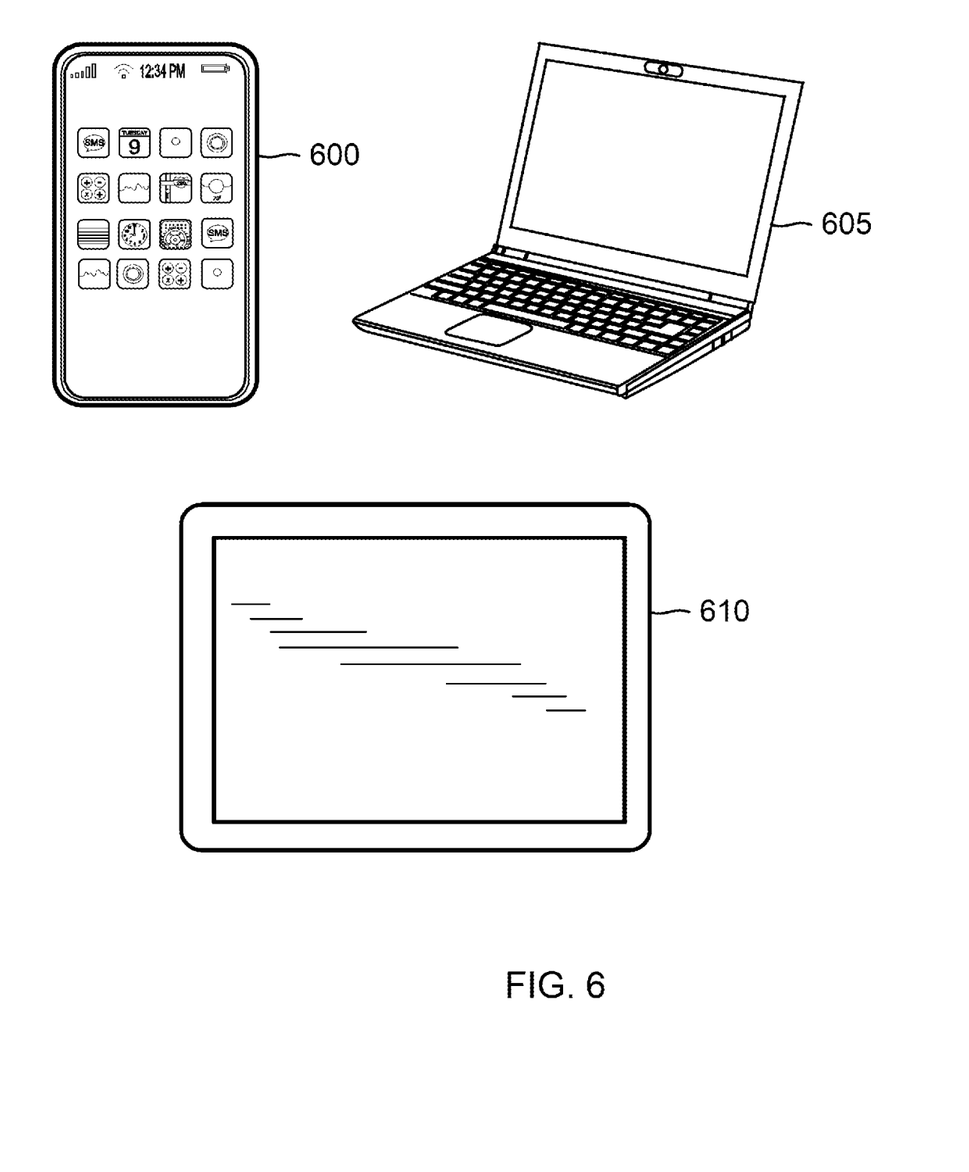
FIG. 6 illustrates some example electronic systems including a pseudo-differential sense amplifier in accordance with an aspect of the disclosure.

A memory having a pseudo-differential sense amplifier disclosed herein may be advantageously employed in a wide variety of electronic systems. For example, as shown in FIG. 6, a cellular telephone 600, a laptop computer 605, and a tablet PC 610 may all include a memory with a pseudo-differential sense amplifier in accordance with the disclosure. Other exemplary electronic systems such as a music player, a video player, a communication device, and a personal computer may also be configured with a memory constructed in accordance with the disclosure.

The disclosure will now be summarized in the following series of clauses:

Clause 1. A sense amplifier, comprising:
- a first transistor coupled to a node for a first bit decision signal;
- a first read bit line coupled to a first bank of bitcells and to a gate of the first transistor;
- a second transistor coupled between the first transistor and ground; and
- a node for a complement of a pre-charge signal for the first bank of bitcells coupled to a gate of the second transistor.

Clause 2. The sense amplifier of clause 1, further comprising:
- a third transistor coupled in parallel with the second transistor between the first transistor and ground, wherein the first read bit line is coupled to a gate of the third transistor.

Clause 3. The sense amplifier of any of clauses 1-2, further comprising:
- a fourth transistor coupled to a node for a second bit decision signal;
- a second read bit line coupled between a second bank of bitcells and a gate of the fourth transistor;
- a fifth transistor coupled between the fourth transistor and ground; and
- a node for a complement of a pre-charge signal for the second bank of bitcells coupled to a gate of the fifth transistor.

Clause 4. The sense amplifier of clause 3, further comprising
- a sixth transistor coupled in parallel with the fifth transistor and ground, wherein the second read bit line is coupled to a gate of the sixth transistor.

Clause 5. The sense amplifier of any of clauses 3-4, further comprising:
- a first cross-coupled transistor having a drain coupled to a drain of the fourth transistor and having a gate coupled to a drain of the first transistor; and a second cross-coupled transistor having a drain coupled to a drain of the first transistor and having a gate coupled to the drain of the fourth transistor.

Clause 6. The sense amplifier of clause 5, wherein a source of the first cross-coupled transistor and a source of the second cross-coupled transistor are both coupled to a node for a memory power supply voltage.

Clause 7. The sense amplifier of clause 6, wherein the first transistor, the second transistor, the fourth transistor, and the fifth transistor each comprises an n-type metal-oxide semiconductor (NMOS) transistor, and wherein the first cross-coupled transistor and the second cross-coupled transistor each comprises a p-type metal-oxide semiconductor (PMOS) transistor.

Clause 8. The sense amplifier of any of clauses 1-7, wherein the first bank of bitcells comprises a first bank of multi-port bitcells.

Clause 9. The sense amplifier of clause 3, further comprising:
a first word line coupling mimicking circuit coupled between the first read bit line and ground.

Clause 10. The sense amplifier of clause 9, wherein the first word line mimicking circuit comprises:
a seventh transistor coupled to the first read bit line, wherein a gate of the seventh transistor is coupled to the node for the complement of the pre-charge signal for the second bank of bitcells; and
an eighth transistor coupled between the seventh transistor and ground, wherein a gate of the eighth transistor is coupled to ground.

Clause 11. The sense amplifier of clause 9, further comprising:
a second word line mimicking circuit coupled between the second read bit line and ground.

Clause 12. The sense amplifier of clause 11, wherein the second word line mimicking circuit comprises:
a ninth transistor coupled to the second read bit line, wherein a gate of the ninth transistor is coupled to the node for the complement of the pre-charge signal for the first bank of bitcells; and
a tenth transistor coupled between the ninth transistor and ground, wherein a gate of the tenth transistor is grounded.

Clause 13. The sense amplifier of any of clauses 1-12, wherein the sense amplifier is integrated into a cellular telephone.

Clause 14. A method of operation for a second amplifier, comprising:
switching on a first switch responsive to a charged state of a first read bit line during a read operation to a first bank of bitcells, wherein the first switch is coupled between a node for a first bit decision signal and ground;
switching on a second switch during the read operation to the first bank of bitcells, wherein the second switch is coupled in parallel with the first switch between the node for the first bit decision signal and ground, to cause the first bit decision signal to discharge to ground at a first rate; and
switching on a third switch during the read operation to the first bank of bitcells wherein the switching of the third switch is responsive to a pre-charging of a second read bit line to a second bank of bitcells and the third switch is coupled between a node for a second bit decision signal and ground, to cause the second bit decision signal to discharge at a second rate that is less than the first rate.

Clause 15. The method of clause 14, further comprising:
sensing a binary one during the read operation to the first bank of bitcells responsive to the discharging of the first bit decision signal being greater than the discharging of the second bit decision signal.

Clause 16. The method of any of clauses 14-15, further comprising:
switching on the third switch responsive to a charged state of the second read bit line during a read operation to a second bank of bitcells;
switching on a fourth switch during the read operation to the second bank of bitcells, wherein the fourth switch is coupled in parallel with the third switch between the node for the second bit decision signal and ground, to cause the second bit decision signal to discharge at the first rate; and
switching on the first switch while the second switch remains off during the read operation to the second bank of bitcells to cause the first bit decision signal to discharge at the second rate.

Clause 17. The method of clause 16, further comprising:
sensing a binary one during the read operation to the second bank of bitcells responsive to the discharging of the second bit decision signal being greater than the discharging of the first bit decision signal.

Clause 18. The method of clause 14, further comprising:
adjusting a discharge rate through the third switch during the read operation to the first bank of bitcells to adjust the second rate.

Clause 19. A memory, comprising:
a node for a first bit decision signal;
a first read bit line;
a first switch coupled to the node for the first bit decision signal, wherein the first switch is configured to close responsive to a charged state of the first read bit line;
a second switch coupled between the first switch and ground, wherein the second switch is configured to close responsive to a charged state of the first read bit line; and
a third switch coupled in parallel with the second switch between the first switch and ground, wherein the third switch is configured to close during a read operation in which the first read bit line is coupled to a first bank of bitcells.

Clause 20. The memory of clause 19, further comprising:
a pair of switches, wherein the second switch is configured to couple to ground through the pair of switches, and wherein the pair of switches are configured to close responsive to offset tuning signals to adjust a discharge rate of the first bit decision signal.

Clause 21. The memory of clause 19, further comprising:
a node for a second bit decision signal;
a second read bit line;
a fourth switch coupled to the node for the second bit decision signal, wherein the fourth switch is configured to close responsive to a charged state of the second read bit line;
a fifth switch coupled between the fourth switch and ground, wherein the fifth switch is configured to close responsive to a charged state of the second read bit line; and
a sixth switch coupled in parallel with the fifth switch between the fourth switch and ground, wherein the sixth switch is configured to close during a read operation in which the second read bit line is coupled to a second bank of bitcells.

Clause 22. The memory of clause 21, further comprising:
a first cross-coupled transistor coupled between the node for the first bit decision signal and a power supply node for a power supply voltage, wherein a gate of the first cross-coupled transistor is coupled to the node for the second bit decision signal; and
a second cross-coupled transistor coupled between the node for the second bit decision signal and the power supply node, wherein a gate of the second cross-coupled transistor is coupled to the node for the first bit decision signal.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A sense amplifier, comprising:
a first transistor coupled to a node for a first bit decision signal;
a first read bit line coupled to a first bank of bitcells and to a gate of the first transistor;
a second transistor coupled between the first transistor and ground;
a third transistor coupled in parallel with the second transistor between the first transistor and ground, wherein the first read bit line is coupled to a gate of the third transistor; and
a node for a complement of a pre-charge signal for the first bank of bitcells coupled to a gate of the second transistor.

2. The sense amplifier of claim 1, further comprising:
a fourth transistor coupled to a node for a second bit decision signal;
a second read bit line coupled between a second bank of bitcells and a gate of the fourth transistor;
a fifth transistor coupled between the fourth transistor and ground; and
a node for a complement of a pre-charge signal for the second bank of bitcells coupled to a gate of the fifth transistor.

3. The sense amplifier of claim 2, further comprising a sixth transistor coupled in parallel with the fifth transistor and ground, wherein the second read bit line is coupled to a gate of the sixth transistor.

4. The sense amplifier of claim 2, further comprising:
a first cross-coupled transistor having a drain coupled to a drain of the fourth transistor and having a gate coupled to a drain of the first transistor; and
a second cross-coupled transistor having a drain coupled to a drain of the first transistor and having a gate coupled to the drain of the fourth transistor.

5. The sense amplifier of claim 4, wherein a source of the first cross-coupled transistor and a source of the second cross-coupled transistor are both coupled to a node for a memory power supply voltage.

6. The sense amplifier of claim 5, wherein the first transistor, the second transistor, the fourth transistor, and the fifth transistor each comprises an n-type metal-oxide semiconductor (NMOS) transistor, and wherein the first cross-coupled transistor and the second cross-coupled transistor each comprises a p-type metal-oxide semiconductor (PMOS) transistor.

7. The sense amplifier of claim 1, wherein the first bank of bitcells comprises a first bank of multi-port bitcells.

8. The sense amplifier of claim 2, further comprising:
a first word line coupling mimicking circuit coupled between the first read bit line and ground.

9. The sense amplifier of claim 8, wherein the first word line mimicking circuit comprises:
a seventh transistor coupled to the first read bit line, wherein a gate of the seventh transistor is coupled to the node for the complement of the pre-charge signal for the second bank of bitcells; and
an eighth transistor coupled between the seventh transistor and ground, wherein a gate of the eighth transistor is coupled to ground.

10. The sense amplifier of claim 8, further comprising:
a second word line mimicking circuit coupled between the second read bit line and ground.

11. The sense amplifier of claim 10, wherein the second word line mimicking circuit comprises:
a ninth transistor coupled to the second read bit line, wherein a gate of the ninth transistor is coupled to the node for the complement of the pre-charge signal for the first bank of bitcells; and
a tenth transistor coupled between the ninth transistor and ground, wherein a gate of the tenth transistor is grounded.

12. The sense amplifier of claim 1, wherein the sense amplifier is integrated into a cellular telephone.

13. A method of operation for a second amplifier, comprising:
switching on a first switch responsive to a charged state of a first read bit line during a read operation to a first bank of bitcells, wherein the first switch is coupled between a node for a first bit decision signal and ground;
switching on a second switch during the read operation to the first bank of bitcells, wherein the second switch is coupled in parallel with the first switch between the node for the first bit decision signal and ground, to cause the first bit decision signal to discharge to ground at a first rate; and
switching on a third switch during the read operation to the first bank of bitcells wherein the switching of the third switch is responsive to a pre-charging of a second read bit line to a second bank of bitcells and the third switch is coupled between a node for a second bit decision signal and ground, to cause the second bit decision signal to discharge at a second rate that is less than the first rate.

14. The method of claim 13, further comprising:
sensing a binary one during the read operation to the first bank of bitcells responsive to the discharging of the first bit decision signal being greater than the discharging of the second bit decision signal.

15. The method of claim 13, further comprising:
switching on the third switch responsive to a charged state of the second read bit line during a read operation to a second bank of bitcells;
switching on a fourth switch during the read operation to the second bank of bitcells, wherein the fourth switch is coupled in parallel with the third switch between the node for the second bit decision signal and ground, to cause the second bit decision signal to discharge at the first rate; and switching on the first switch while the second switch remains off during the read operation to the second bank of bitcells to cause the first bit decision signal to discharge at the second rate.

16. The method of claim 15, further comprising:
sensing a binary one during the read operation to the second bank of bitcells responsive to the discharging of the second bit decision signal being greater than the discharging of the first bit decision signal.

17. The method of claim 13, further comprising:
adjusting a discharge rate through the third switch during the read operation to the first bank of bitcells to adjust the second rate.

18. A memory, comprising:
a node for a first bit decision signal;
a first read bit line;
a first switch coupled to the node for the first bit decision signal, wherein the first switch is configured to close responsive to a charged state of the first read bit line;
a second switch coupled between the first switch and ground, wherein the second switch is configured to close responsive to a charged state of the first read bit line; and
a third switch coupled in parallel with the second switch between the first switch and ground, wherein the third switch is configured to close during a read operation in which the first read bit line is coupled to a first bank of bitcells.

19. The memory of claim 18, further comprising:
a pair of switches, wherein the second switch is configured to couple to ground through the pair of switches, and wherein the pair of switches are configured to close responsive to offset tuning signals to adjust a discharge rate of the first bit decision signal.

20. The memory of claim 18, further comprising:
a node for a second bit decision signal;
a second read bit line;
a fourth switch coupled to the node for the second bit decision signal, wherein the fourth switch is configured to close responsive to a charged state of the second read bit line;
a fifth switch coupled between the fourth switch and ground, wherein the fifth switch is configured to close responsive to a charged state of the second read bit line; and
a sixth switch coupled in parallel with the fifth switch between the fourth switch and ground, wherein the sixth switch is configured to close during a read operation in which the second read bit line is coupled to a second bank of bitcells.

21. The memory of claim 20, further comprising:
a first cross-coupled transistor coupled between the node for the first bit decision signal and a power supply node for a power supply voltage, wherein a gate of the first cross-coupled transistor is coupled to the node for the second bit decision signal; and
a second cross-coupled transistor coupled between the node for the second bit decision signal and the power supply node, wherein a gate of the second cross-coupled transistor is coupled to the node for the first bit decision signal.

* * * * *